(12) United States Patent
Park

(10) Patent No.: US 12,232,274 B2
(45) Date of Patent: Feb. 18, 2025

(54) DISPLAY APPARATUS

(71) Applicant: LG Display Co., Ltd., Seoul (KR)

(72) Inventor: Sehwan Park, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 297 days.

(21) Appl. No.: 17/853,400

(22) Filed: Jun. 29, 2022

(65) Prior Publication Data

US 2023/0007791 A1 Jan. 5, 2023

(30) Foreign Application Priority Data

Jun. 30, 2021 (KR) ........................ 10-2021-0085909

(51) Int. Cl.
*H05K 5/00* (2006.01)
*H05K 5/03* (2006.01)
*H10K 59/12* (2023.01)
*H10K 77/10* (2023.01)

(52) U.S. Cl.
CPC ............. *H05K 5/0018* (2022.08); *H05K 5/03* (2013.01); *H10K 59/12* (2023.02); *H10K 77/111* (2023.02)

(58) Field of Classification Search
CPC ...... H05K 5/0018; H05K 5/03; H10K 77/111; H10K 59/12

USPC ....................................................... 361/766, 4
See application file for complete search history.

(56) References Cited

U.S. PATENT DOCUMENTS

| | | | |
|---|---|---|---|
| 10,019,029 B1 * | 7/2018 | Yu ........................ | H05K 7/1417 |
| 2020/0409499 A1 * | 12/2020 | Ogura ................... | G06F 3/0412 |
| 2022/0284214 A1 * | 9/2022 | Tomasetta .......... | G01B 11/2513 |

FOREIGN PATENT DOCUMENTS

| | | |
|---|---|---|
| KR | 20130122884 A | 11/2013 |
| KR | 20170063174 A | 6/2017 |
| KR | 10-1780902 B1 | 9/2017 |
| KR | 10-2021-0025470 A | 3/2021 |

\* cited by examiner

*Primary Examiner* — Binh B Tran
(74) *Attorney, Agent, or Firm* — Seed IP Law Group LLP

(57) ABSTRACT

A display apparatus includes a display panel, a decoration film and a cover glass disposed on a front surface of the display panel, a core plate supporting a rear surface of the display panel and attached to the rear surface of the display panel, and a rear cover coupled to a rear surface of the core plate. The core plate has a protruding portion protruding toward the cover glass, the rear cover has a coupling portion coupled to the protruding portion so as to cover at least a portion of the protruding portion, and resin is applied to at least a portion of the coupling portion with the rear cover adhered to the decoration film or the cover glass via the resin.

17 Claims, 16 Drawing Sheets

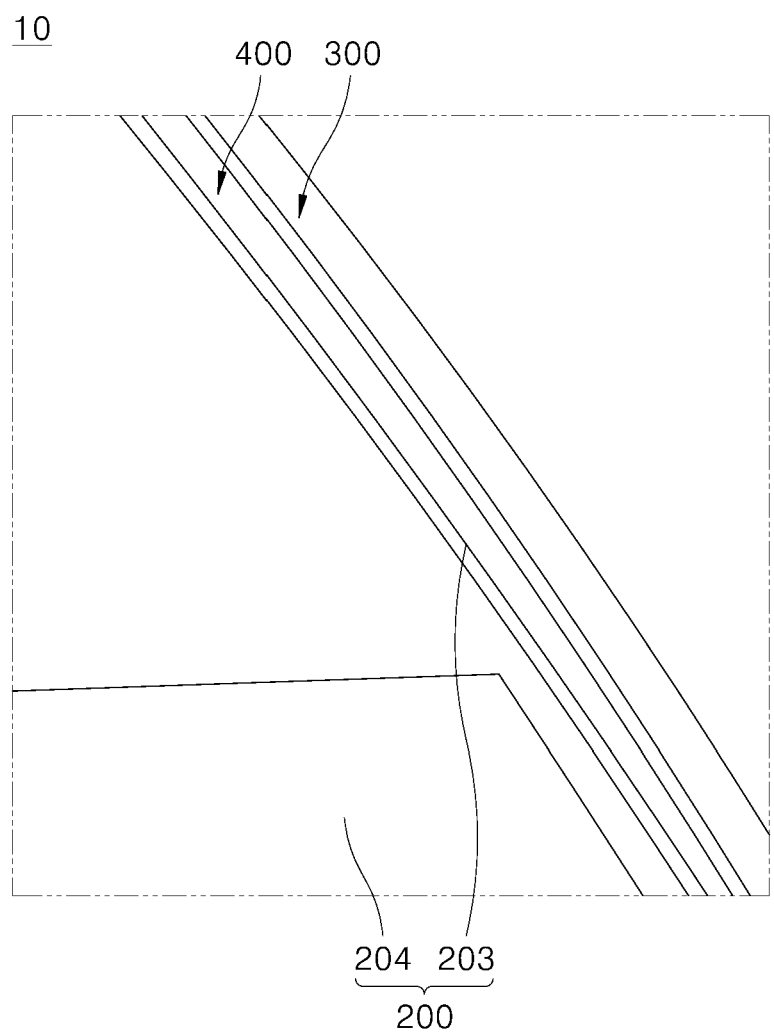

DISPLAY APPARATUS

CROSS-REFERENCE TO RELATED APPLICATION

This application claims priority from Korean Patent Application No. 10-2021-0085909 filed on Jun. 30, 2021 in the Korean Intellectual Property Office, and all the benefits accruing therefrom under 35 U.S.C. § 119, the contents of which are hereby incorporated by reference in their entirety.

BACKGROUND

Technical Field

The present disclosure relates to a display apparatus, and more particularly, to a display apparatus in which a display panel is bendable.

Description of the Related Art

Recently, as we enter the information age, a field of a display that visually presents an electrical information signal has developed rapidly. In response to this trend, various display apparatuses are being developed.

Specific examples of these display apparatus include a liquid crystal display apparatus (LCD), an organic light-emitting display apparatus (OLED), and a quantum dot display apparatus.

However, there are known deficiencies and limitations with such display apparatus. For example, while it may generally be desirable to increase the viewable area of a screen of such types of display apparatus, increasing the viewable area reduces the bezel area around the screen for connections between various components of the display apparatus and may result in weaker connections that are more prone to failure. These problems are particularly pronounced for more recently developed foldable and bendable displays. In addition, certain aspects of known display apparatus are assembled manually, which increases the likelihood of errors in assembly as the size of the working space or bezel area on the apparatus decreases to increase the viewable area of the screen.

BRIEF SUMMARY

A display apparatus of the present disclosure may be a display apparatus with thinness, light weight, low power consumption, and excellent performance.

In an embodiment, a self light-emitting display apparatus, such as an organic light-emitting display apparatus, is considered a competitive application because the organic light-emitting display apparatus does not require a separate light source and implements a compact apparatus and achieves clear color display. The organic light-emitting display apparatus has a self light-emitting element in each pixel, meaning that there is no separate light source. The light-emitting element has two electrodes facing each other and a light-emitting layer which is disposed between the two electrodes so as to emit light when transported electrons and holes are recombined with each other therein. An organic light-emitting element is a self light-emitting element using a thin light-emitting layer between electrodes, and has an advantage that it can be implemented thinly. Further, the organic light-emitting display apparatus does not require a separate light source apparatus and thus is flexible, bendable, or foldable so as to be implemented as a foldable display apparatus which may be designed in various forms.

Recently, users have preferred a bezel-less or bezel-free design in which a display area is full when the user views a screen. The inventors have realized that an edge area of the display area includes connections to couple or mount a display panel or a display apparatus to a module. For example, a decoration plate and a rear cover may be fixed, via a screw or a tape, to a side surface of a cover glass or the display panel in the edge area. The edge area may be a bezel in a front view of the display apparatus. A size of the bezel for the fixing the display panel may increase to allow room for such connections. In order to achieve the user's preferred bezel-less or bezel-free design, the inventors note that a space of a connection point between the display panel or the display apparatus and the module may be reduced or minimized. Specifically, the inventors propose that in order to minimize the bezel area, a structure of a core plate supporting a back surface of the display panel and a structure of a rear cover that is disposed on a back surface of the core plate so as to cover the back surface of the display apparatus may be different from each other such that the space at the connection point between the display apparatus and the module may be reduced or minimized.

Further, the inventors also note that efficient large production may be reduced if there is use of the screw or the tape in a process of coupling the core plate and the rear cover to the display panel. The coupling process using the screw or the tape may be performed manually by an operator, and defects may occur due to error of the manual work. A scheme for omitting or minimizing the manual work may therefore be considered desirable and advantageous over known display apparatus.

A scheme for securing robustness of the coupling while an operator easily couples the core plate and the rear cover to the display panel and a structure in which the core plate and the rear cover are detachable therefrom for repairing a problem after the coupling may also be considered desirable and advantageous relative to known display apparatus.

When using the bezel-less or bezel-free design, the user may have greater immersion in the screen, and aesthetics of the display apparatus may be improved.

The concepts of the present disclosure are intended to overcome the above disadvantages of known display apparatus. In an embodiment of the present disclosure, a bezel size of a display apparatus is reduced so that the user may have greater immersion in the screen.

In more detail, a core plate supports a back surface of the display panel or allows the display panel to be bent in a desired shape, and at the same time, couples the display apparatus to a module. A rear cover covers a rear surface of the core plate and plays a role in constituting an appearance of the rear surface of the display apparatus. In this regard, the concepts of the present disclosure improve workability by improving the coupling between the core plate and the rear cover.

A scheme that improves the workability of the operator and at the same time secures the robustness of the coupling in the coupling of the core plate and the rear cover is also contemplated herein. When the coupling is weak though the workability is improved, quality problems may occur. For example, a display apparatus attached to a vehicle may be exposed to extreme cold or extreme hot outdoor temperatures. The coupling between the core plate and the rear cover and the display panel may become loose or otherwise fail due to periodic or irregular vibrations that occur during vehicle driving. Thus, the concepts of the present disclosure achieve a robust coupling between the core plate and the rear cover.

In an embodiment of the present disclosure, a design of the core plate and the rear cover is provided in order to stably implement the bezel-less or bezel-free structure of the display apparatus.

In one or more embodiments of the present disclosure, a display apparatus includes: a display panel; a decoration film and a cover glass disposed on a front surface of the display panel; a core plate supporting a rear surface of the display panel and attached to the rear surface thereof; and a rear cover coupled to a rear surface of the core plate; wherein the core plate has a protruding portion protruding toward the cover glass, wherein the rear cover has a coupling portion coupled to the protruding portion so as to covers at least a portion of the protruding portion, wherein resin is applied to at least a portion of the coupling portion and the rear cover is adhered to the decoration film or the cover glass via the resin.

In one or more embodiments of the present disclosure, a display apparatus includes: a display panel including a flexible substrate; a decoration film and a cover glass disposed on a front surface of the display panel; a core plate supporting a rear surface of the display panel and attached to the rear surface thereof; and a rear cover coupled to a rear surface of the core plate; wherein the core plate has an edge area divided into a first area, a second area and a third area, wherein the core plate has a protruding portion protruding toward the cover glass, wherein the protruding portion is disposed in the edge area, wherein resin is applied to at least a portion of the protruding portion and the rear cover is adhered to the decoration film or the cover glass via the resin.

According to an embodiment of the present disclosure, a display apparatus having a bezel-free or bezel-less form may be provided via a coupling structure of the display panel and the core plate and the rear cover constituting the display apparatus. Changing the coupling structure between the core plate and the rear cover may allow a side space of the display panel to be minimized and thus the bezel area may be narrowed while allowing for a strong and reliable coupling between various aspects of the display apparatus to improve performance and reliability.

Therefore, the user of the display apparatus may aesthetically view the light-emitting screen occupying a substantial area of the front surface of the display apparatus. A compact display apparatus may be realized due to the narrow bezel. This may be more advantageous for an interior design of the vehicle, among other applications.

The display apparatus according to an embodiment of the present disclosure may be simplified by changing the coupling structure of the display panel, the core plate, and the rear cover. This means that work of an assembly worker is simplified, and the productivity improvement effect may be expected due to the simplification of the process. For example, in a conventional work scheme, the structures such as the core plate, the rear cover, and the decoration plate are coupled to each other using side screws or tapes. According to the present disclosure, improving the coupling structure may allow the core plate and the rear cover to be coupled to each other without separate fastening devices.

Benefits of the concepts of the present disclosure are not limited to the above-mentioned benefits. Other benefits and advantages of the present disclosure that are not mentioned may be understood based on following descriptions, and may be more clearly understood based on embodiments of the present disclosure. Further, it will be easily understood that the benefits and advantages of the present disclosure may be realized using the concepts of the disclosure and combinations thereof. Specific details of other embodiments are described with reference to the detailed description and drawings.

The benefits and advantages described above do not specify essential characteristics of the claims, and thus do not limit the scope of the present disclosure.

BRIEF DESCRIPTION OF THE SEVERAL VIEWS OF THE DRAWINGS

FIG. 6 is a detailed perspective view showing the core plate and the rear cover of FIG. 4 coupled to each other via a resin.

DETAILED DESCRIPTIONS

Figure 1A:
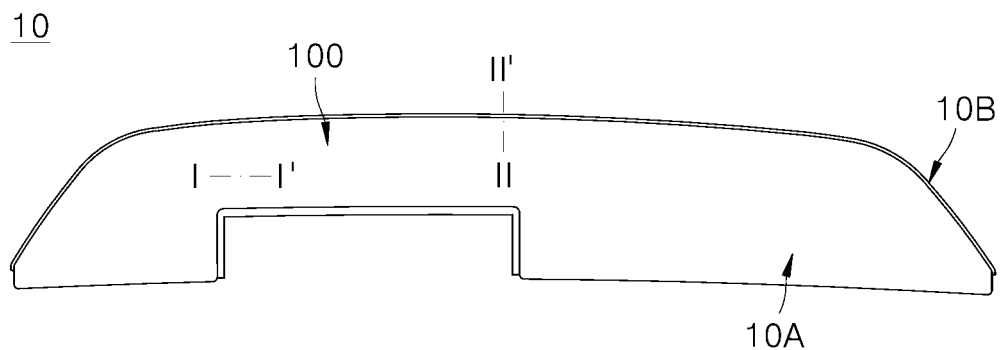
FIG. 1A and FIG. 1B are plan views showing a front surface and a rear surface of a display apparatus according to an embodiment of the present disclosure, respectively.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs.

A shape, a size, a ratio, an angle, a number, etc., disclosed in the drawings for describing the embodiments of the present disclosure are examples only, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise," "comprising," "include," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter.

Further, as used herein, when a layer, film, region, plate, or the like is disposed "below" or "under" another layer, film, region, plate, or the like, the former may directly contact the latter or still another layer, film, region, plate, or the like may be disposed between the former and the latter.

As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after," "subsequent to," "before," etc., another event may occur therebetween unless "directly after," "directly subsequent" or "directly before" is indicated.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer, or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "display apparatus" may include, in a narrow sense, a display apparatus including a liquid crystal module (LCM), an organic light-emitting diode (OLED) module, or a quantum dot (QD) module including a display panel and a driver for driving the display panel. Moreover, the display apparatus may include, in a broad sense, a set electronic device, a set device or a set apparatus such as an automotive display or other equipment display for a vehicle, mobile electronic device such as a smartphone or an electronic pad, and a complete product or a final product such as a laptop computer, a television, a computer monitor including the LCM, the OLED module, or the QD module.

Therefore, the display apparatus in accordance with the present disclosure may include, in the narrow sense, a display apparatus itself including, for example, the LCM, the OLED module, QD module, etc., and may include, in a broad sense, the set device as an application product or an end-user device including a complete product or a final product including the LCM, the OLED module, or the QD module.

Moreover, in some cases, the LCM, OLED module, or QD module composed of the display panel and the driver may be expressed as "display apparatus" in a narrow sense. The electronic device as a complete product including the LCM, OLED module or QD module may be expressed as "set device" in a broad sense. For example, the display apparatus in the narrow sense may include a display panel such as a liquid crystal panel, an organic light-emitting display panel, or a quantum dot display panel, and a source PCB as a controller for driving the display panel. The set device in the broad sense may include a display panel such as a liquid crystal panel, an organic light-emitting display panel, or a quantum dot display panel, a source PCB as a controller for driving the display panel, and a set PCB as a set controller that is electrically connected to the source PCB and controls the set device.

As used herein, the display panel may be of any type of the display panels such as a liquid crystal display panel, an organic light emitting diode (OLED) display panel, a quantum dot (QD) display panel, and an electroluminescent display panel, etc. The display panel used in the present disclosure may be not limited to a specific display panel including a flexible substrate for the OLED display panel and an underlying back plate support structure and having a bendable bezel. Moreover, the display panel used in the display apparatus according to an embodiment of the present disclosure is not limited to a shape or a size of the display panel.

More specifically, when the display panel is embodied as the organic light emitting diode (OLED) display panel, the display panel may include a plurality of gate lines and data lines, and pixels respectively formed in areas where the gate lines and the data lines intersect with each other. Moreover, the display panel may be configured to include an array including a thin-film transistor as an element for selectively applying a voltage to each pixel, an organic light-emitting element layer on the array, and an encapsulation substrate or an encapsulation layer disposed on the array to cover the organic light-emitting element layer. The encapsulation layer protects the thin-film transistor and the organic light-emitting element layer from external impact, and may prevent moisture or oxygen from penetrating into the organic light-emitting element layer. Moreover, the light emitting layer formed on the array may include an inorganic light emitting layer, for example, a nano-sized material layer, or a quantum dot.

FIG. 1 illustrates an embodiment of an organic light emitting diode display panel 100 that may be incorporated into a display apparatus 10.

Figure 1B:
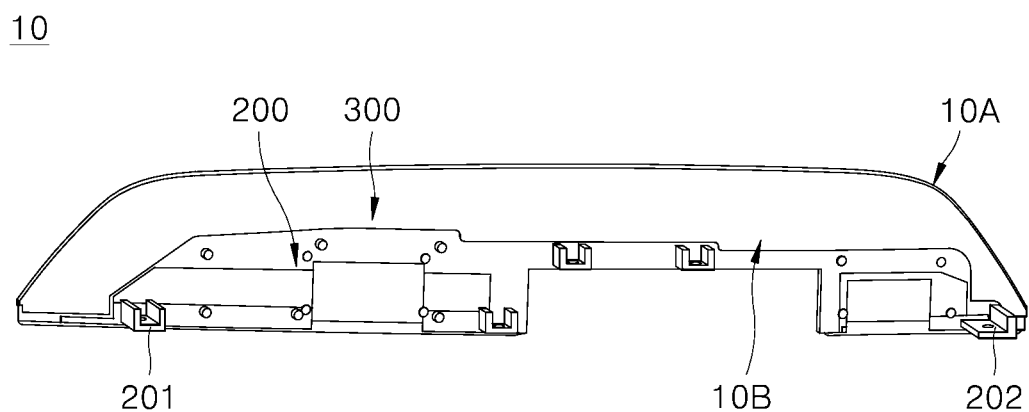

FIG. 1A and FIG. 1B are plan views showing a front surface 10A and a rear surface 10B of the display apparatus 10 according to an embodiment of the present disclosure, respectively. FIG. 1A shows the front surface 10A including the display panel 100, and FIG. 1B shows the rear surface 10B thereof with a core plate 200 and a rear cover 300 of the display apparatus 10 exposed. As shown in FIG. 1B, the core plate 200 may have a first connector 201 and a second connector 202 for connecting the core plate 200 to a coupling portion of a vehicle to attach and fix the display apparatus 10 to the vehicle. Each of the first and second connectors 201 and 202 may have a bolt hole for receiving a bolt for coupling the display apparatus 10 to the vehicle. However, a shape or the number of the connectors is not limited thereto. The display apparatus 10 or the display panel 100 may generally have a rectangular or square shape. However, the disclosure is not limited thereto. The display apparatus 10 or the display panel 100 may have a shape having an acute or obtuse outline or a curved outline as shown in FIG. 1A and FIG. 1B.

In particular, the front surface 10A may be an outwardly facing surface of the apparatus 10 for displaying information to a user via the display panel 100, as described in more detail below with reference to at least FIG. 2. The rear surface 10B is a backside surface of the apparatus 10 for mounting the display apparatus 10 to a support structure, such as integrating the display apparatus 10 in, and coupling the display apparatus 10 to, a vehicle. Thus, in an embodiment, the display panel 100 of the display apparatus 10 may correspond to a dashboard or other electronic display of a vehicle with the front surface 10A visible to a user while sitting in the vehicle and the display panel 100 displaying certain information to the user on the front surface 10A of the display apparatus. Referring to FIG. 1B, on the rear surface of the display apparatus 10, the core plate 200 may be mainly connected to the coupling portion of the vehicle, and the rear cover 300 may be exposed.

Figure 2:
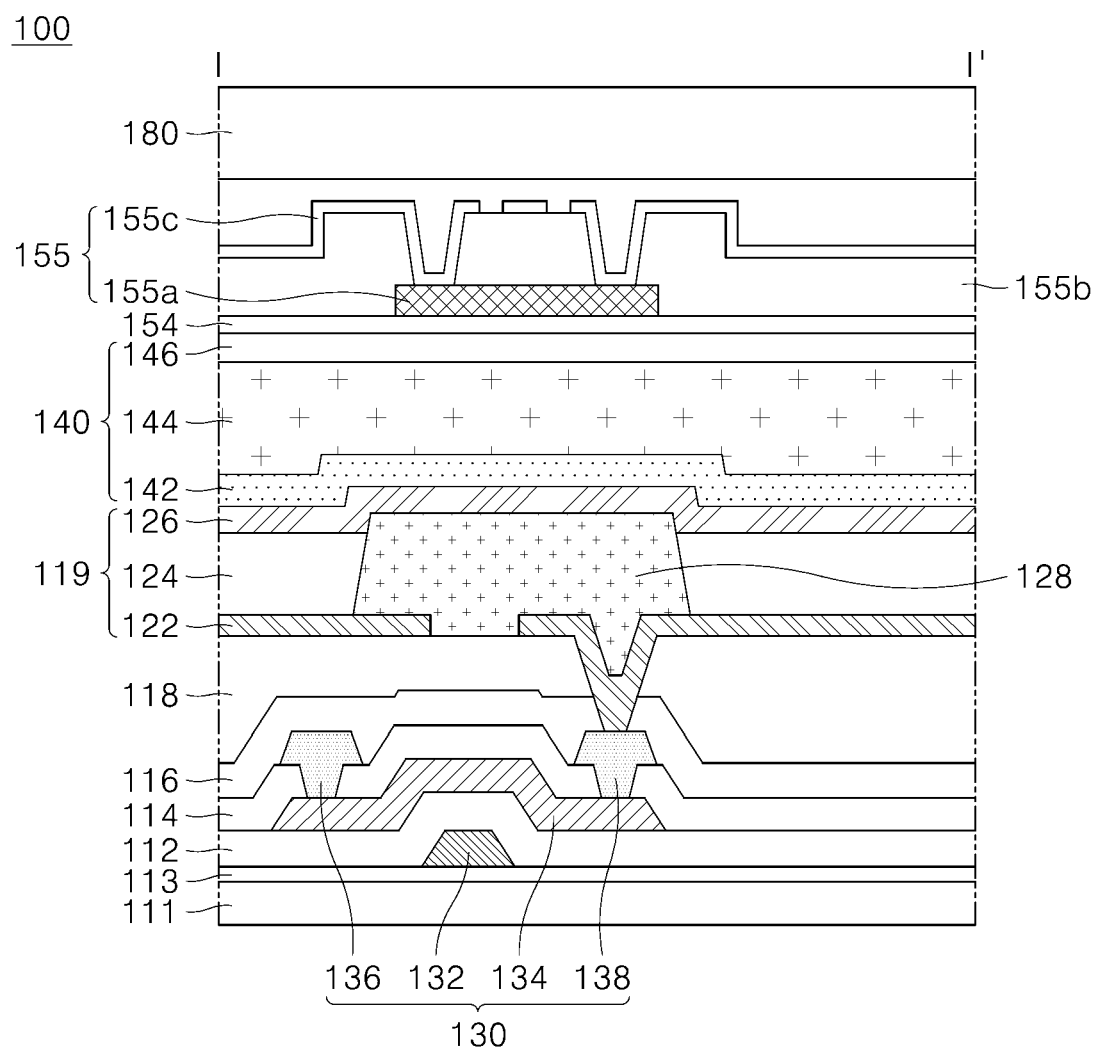
FIG. 2 is an enlarged cross-sectional view of a display panel of the display apparatus of FIG. 1A taken along I-I' in FIG. 1A.

FIG. 2 is a cross-sectional view of the display panel 100 of the display apparatus 10 along line I-I' in FIG. 1. The display panel 100 may include a substrate 111 supporting various components of the display panel 100. The substrate 111 may be made of a transparent insulating material, for example, an insulating material such as glass or plastic. When the substrate 111 is made of plastic, the substrate may be embodied as a plastic film or a plastic substrate. For example, the substrate 111 may be in a form of a film including one of a polyimide-based polymer, a polyether-based polymer, a silicone-based polymer, an acrylic polymer, a polyolefin-based polymer, and a copolymer thereof. The polyimide may be applied to a high-temperature process and may be able to be coated and thus may be used for the plastic substrate.

A buffer layer 113 may be located on the substrate 111, and directly on the substrate 111 in an embodiment. The buffer layer 113 may protect a thin-film transistor (TFT) from impurities such as alkali ions from the substrate 111. The buffer layer 113 may be made of a silicon oxide ($SiO_x$) or a silicon nitride ($SiN_x$), or may be composed of multiple layers made thereof. However, the disclosure is not limited thereto and the buffer layer may be omitted in some embodiments.

A thin-film transistor 130 may be disposed on the buffer layer 113. A gate electrode 132, a gate insulating layer 112, a semiconductor layer 134, an interlayer insulating layer 114, and source and drain electrodes 136 and 138 are sequentially stacked to form the thin-film transistor 130. At least one thin-film transistor 130 may be disposed in a plurality of sub-pixels provided in an active area.

Although the thin-film transistor 130 shown in FIG. 2 is of a bottom gate type, the disclosure is not limited thereto. A top gate type in which an arrangement order of the semiconductor layer 134 and the gate electrode 132 is reversed is also applicable.

The semiconductor layer 134 may be disposed on a specific portion of the substrate 111 or the buffer layer 113. The semiconductor layer 134 may be made of polysilicon (p-Si). In this case, a portion of the semiconductor layer 134 acting as an electrode layer may be doped with impurities. Further, the semiconductor layer 134 may be made of amorphous silicon (a-Si), or may be made of various organic semiconductor materials such as pentacene. In another example, the semiconductor layer 134 may be made of oxide. The gate insulating layer 112 may be made of an inorganic insulating material such as silicon oxide ($SiO_x$) or silicon nitride ($SiN_x$), or may also be made of an organic insulating material. The gate electrode 132 may be made of various conductive materials, for example, magnesium (Mg), aluminum (Al), nickel (Ni), chromium (Cr), molybdenum (Mo), tungsten (W), gold (Au), or an alloy thereof. However, the disclosure is not limited thereto.

The first interlayer insulating layer 114 may be made of an insulating material such as silicon oxide ($SiO_x$) or silicon nitride ($SiN_x$), or may also be made of an organic insulating material. Contact holes through which the source and drain areas are respectively exposed may be formed by selectively removing a portion of the first interlayer insulating layer 114.

Each of the source and drain electrodes 136 and 138 may be formed on the first interlayer insulating layer 114 and in a form of a single layer or multiple layers and may be made of an electrode material.

An inorganic protective layer 116 and a planarization layer 118 may be disposed on the thin-film transistor so as to cover the source and drain electrodes 136 and 138. The inorganic protective layer 116 and the planarization layer 118 protect the thin-film transistor and planarize the step due to the thin-film transistor. The inorganic protective layer 116 may be composed of an inorganic insulating film such as a silicon nitride film ($SiN_x$) or a silicon oxide film ($SiO_x$). The planarization layer 118 may be composed of an organic insulating film made of, for example, BCB (benzocyclobutene) or acryl. Each of the inorganic protective layer 116 and the planarization layer 118 may be formed as a single layer or may be composed of double or multiple layers. One of the inorganic protective layer 116 and the planarization layer 118 may be omitted.

A light-emitting element 119 of the display panel 100 may have a form in which a first electrode 122, an organic light-emitting layer 124, and a second electrode 126 are sequentially stacked on the thin-film transistor 130. That is, the light-emitting element 119 includes the first electrode 122 connected to the drain electrode 138 through a connection hole 148 extending through the planarization layer 118 and the inorganic protective layer 116, the organic light-emitting layer 124 located on the first electrode 122, and the second electrode 126 positioned on the organic light-emitting layer 114.

When the display panel 100 is of a top emission type in which emits light upwardly toward the second electrode 126, the first electrode 122 may include an opaque conductive material with high reflectivity. The reflective conductive material may include, for example, silver (Ag), aluminum (Al), gold (Au), molybdenum (Mo), tungsten (W), chromium (Cr), or an alloy thereof. However, the disclosure is not limited thereto.

A bank 128 exposes the light-emitting area and is formed in the remaining area except for the light-emitting area. Accordingly, the bank 128 has a bank hole or an opening defined therein exposing the first electrode 122 and corresponding to the light-emitting area. The bank 128 may be made of an inorganic insulating material such as a silicon nitride film ($SiN_x$) or a silicon oxide film ($SiO_x$), or an organic insulating material such as BCB, an acrylic resin or an imide resin.

The organic light-emitting layer 124 is disposed on the first electrode 122 exposed through the bank hole or the opening in the bank 128. The organic light-emitting layer 124 may include a hole injection layer, a hole transport layer, a light-emitting layer, an electron transport layer, and an electron injection layer. Further, the organic light-emitting layer 124 may have a single stack structure in which a single light-emitting layer emits light of a single color, or include a multiple stack structure in which multiple stacks are stacked, and each stack has a single light-emitting layer emitting light of a single color. In this case, for display of various colors, adjacent sub-pixels may emit light of different colors. For example, sub-pixels respectively having red, green, and blue light-emitting layers may be disposed side by side or spaced apart from each other, while sub-pixels of a specific color are disposed in parallel manner to each other and other sub-pixels are disposed diagonally to form a triangle shape or a pentile structure.

In another example, white sub-pixels may be added. In another example of the arrangement of the organic light-emitting layer 124, multiple stacks including light-emitting layers that emit light of different colors are stacked to express a white color. When the white color is expressed from the stack structure, a separate color filter may be added to each pixel.

The second electrode 126 is disposed on the organic light-emitting layer 124. When the display panel 100 operates in a top emission scheme, the second electrode 126 may be made of a transparent conductive material such as Indium Tin Oxide (ITO) or Indium Zinc Oxide (IZO), or may be made of a semi-transmissive metal or metal alloy such as MgAg. Thus, the light generated from the organic light-emitting layer 124 may be emitted upwardly toward the second electrode 126.

A capping layer may be disposed on the second electrode 126. The capping layer may protect the light-emitting element 119, and may be made of a material having an appropriate refractive index to help extraction of light emitted from the second electrode 126.

An encapsulation layer 140 may be disposed on the light-emitting element 119. The encapsulation layer 140 prevents the penetration of oxygen and moisture from the outside into the light-emitting material and the electrode material in order to prevent oxidation of the light-emitting material and the electrode material. When the light-emitting element 119 is exposed to the moisture or oxygen, pixel shrinkage phenomenon in which the light-emitting area is reduced may appear, or dark spots may occur in the light-emitting area. The encapsulation layer 140 may have a structure in which first and second inorganic layers 142 and 146 made of glass, metal, aluminum oxide ($AlO_x$) or silicon (Si)-based material, and an organic layer 144 that improves the planarization performance and relieves the stress between the layers due to the bending of the display panel 100 may be alternately stacked. A component of the organic layer 144 may include an organic insulating material such as acrylic resin, epoxy resin, polyimide, polyethylene, or silicon oxycarbon (SiOC). The first and second inorganic layers 142 and 146 serve to block the penetration of moisture or oxygen, and the organic layer 144 serves to planarize the surface of the first inorganic layer 142. When the encapsulation layer 140 is formed as a multi-layered thin-film layer, a passage along which moisture or oxygen travels becomes longer and more complicated than that in a case when the encapsulation layer 140 is formed as a single layer, thereby making it difficult for the moisture/oxygen to invade into the light-emitting element.

A protective layer may be further formed between the light-emitting element 119 and the encapsulation layer 140 to protect the encapsulation layer 140 such that a side surface of the encapsulation layer 140 is not peeled off or the uniformity thereof is not affected during the manufacturing process of the encapsulation layer 140.

Referring to FIG. 2, a polarizing layer 154 may be disposed on the encapsulation layer 140. The polarizing layer 154 may minimize the effect of light from an external light source entering the panel 100 on the semiconductor layer 134 or the light-emitting layer 124.

Referring to FIG. 2, a touch sensor layer 155 may be disposed on the polarizing layer 154. The touch sensor layer 155 may have a structure in which a first touch electrode 155a and a second touch electrode 155c are disposed to intersect each other, and a voltage signal is applied to one thereof and the other thereof senses the voltage signal. Each of the first touch electrode 155a and the second touch electrode 155c may be disposed on a touch insulating layer 155b and may be patterned in a polygonal or circular shape such that the patterns are spaced apart from each other.

A cover member 180 may be disposed on the touch sensor layer 155. An adhesive layer may be further disposed between the touch sensor layer 155 and the cover member 180 such that the touch sensor layer 155 and the cover member 180 are bonded to each other.

Figure 3A:
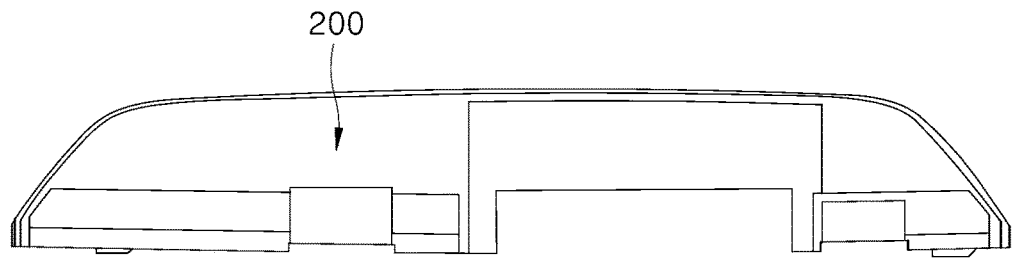
FIG. 3A and FIG. 3B are plan views showing a core plate and a rear cover of the display apparatus of FIG. 1A, respectively.
Figure 3B:
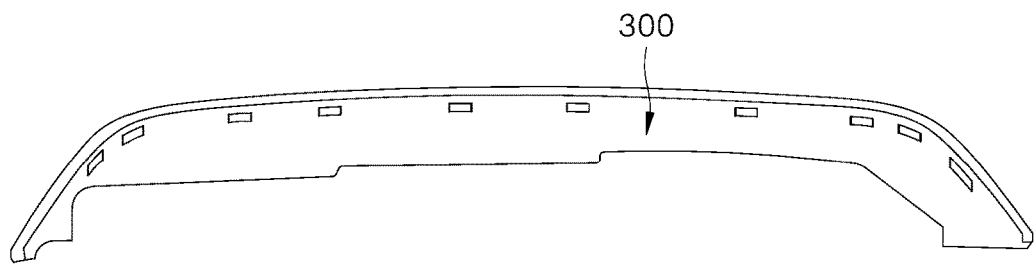

FIG. 3A and FIG. 3B are plan views of the core plate 200 and the rear cover 300, respectively. Referring to FIG. 3A, the core plate 200 may be manufactured in the same shape as that of the display panel 100. Thus, the core plate 200 may sufficiently reinforce and support the back surface of the display panel 100. For this purpose, the core plate 200 may be made of a metal-based material that has greater rigidity than that of the display panel 100. For example, the core plate 200 may be manufactured through a die casting process using magnesium (Mg), aluminum (Al), etc., having relatively good workability. However, the material of the core plate 200 is not limited thereto. Another reason why the core plate 200 is made of the metal-based material is that the metal may dissipate heat that may be generated from the display panel 100 well. In other words, the core plate 200 may have dual functionality as a support for the display panel 100 while also acting as a heat sink for dissipating heat generated by operation of the display panel 100.

More specifically, a polyimide-based polymer or plastic used as the material of the substrate for the display panel 100 may have poor thermal conductivity, and thus may not emit the heat from a driver of the display panel 100. This may adversely affect the light-emitting element 119 (FIG. 2). Therefore, when the core plate 200 made of a metal material with excellent thermal conductivity is disposed on the back surface of the display panel 100, the heat from the display panel 100 may be dissipated by the core plate 200 to improve reliability and performance of the display panel 100. The die casting process is one of the precision casting methods to obtain a cast of the same shape as a shape of a mold by injecting molten metal into the mold which is made of rigid material and has been precisely shaped so as to match a target shape. A part produced by the die casting process has an accurate dimension and thus hardly needs a finishing work, and further has excellent mechanical properties and is subjected to mass production. For this reason, the die casting process may be mainly used for the production of precise parts such as vehicle parts, electric parts, and optical parts. Other formation techniques and processes for the core plate 200 are also contemplated herein. In addition, other heat dissipation techniques, such as separate heat sinks and heat dissipation plates are contemplated herein instead of, or addition to the, core plate 200.

Referring to FIG. 3B, the rear cover 300 may be disposed to cover at least a portion of a rear surface of the core plate 200 of FIG. 3A. The assembly of the display panel 100, the core plate 200, and the rear cover 300 is described and shown in more detail with reference to FIG. 4. The rear cover 300 may have a shape different from that of the display panel 100, and may serve as an exterior of the rear surface of the display apparatus 10 or may play a role of protecting some parts of the display apparatus 10. An area of the core plate 200 where the display apparatus 10 is mounted on the vehicle or other support may be empty without the rear cover 300 in consideration of coupling of the core plate 200 directly to the vehicle. For example, an upper portion of the rear cover 300 has the same outline as that of the display panel 100 or the core plate 200, while a lower portion of the rear cover 300 may be an empty space because the connectors for coupling the core plate 200 to the vehicle or set are disposed in an area of the core plate corresponding to the empty space of the rear cover. As a result, the rear cover 300 may be disposed on a portion of the core plate 200 that does not include connectors and other like structures for coupling the core plate 200 to the vehicle or other support. The rear cover 300 may be made of thermoplastic plastic. For example, the rear cover 300 may be made of polyethylene, polypropylene, polystyrene, polycarbonate, or ABS (Acrylonitrile, Butadiene, and Styrene) and may be manufactured using a plastic injection molding. In embodiments where the rear cover 300 is ABS (acrylonitrile, butadiene, and styrene), styrene may be the primary raw material among the three materials.

The injection molding is a representative processing method for molding the thermoplastic resin, and has the advantage of being able to mold small to large sized products and of achieving mass-production via repeated injections. However, other processing methods and techniques are also contemplated herein.

Figure 4:
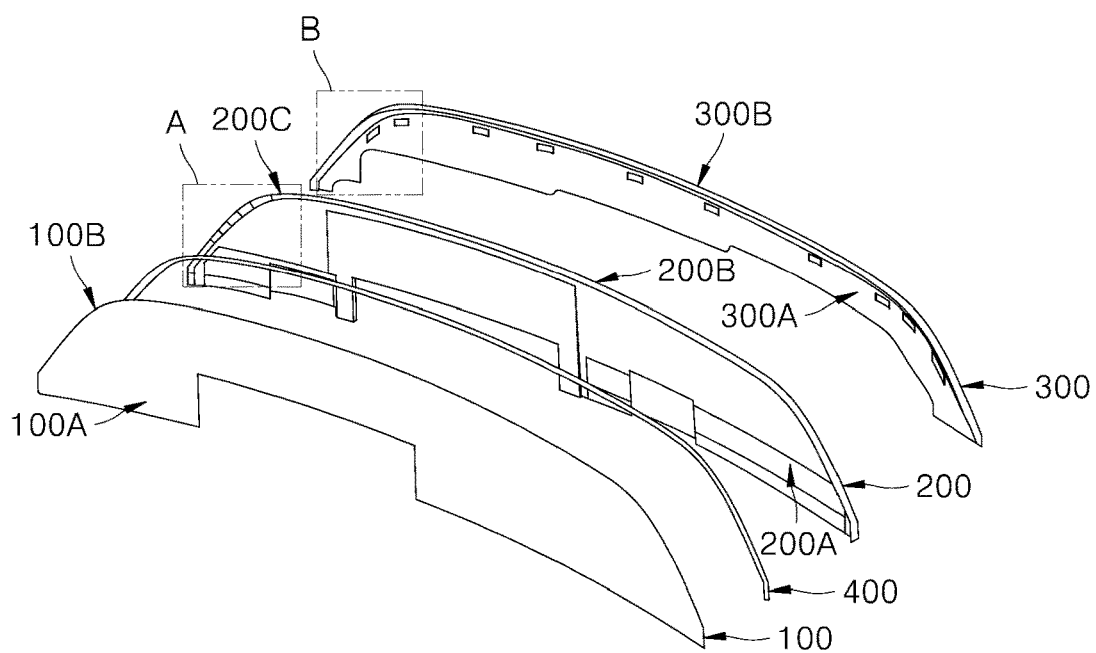
FIG. 4 is an exploded perspective view of the display apparatus of FIG. 1A.

FIG. 4 is an exploded perspective view of the display apparatus 10. The display apparatus 10 includes the display panel 100, the core plate 200 supporting the display panel 100, and the rear cover 300 disposed on the core plate 200 as sequentially shown in FIG. 4. In more detail, the display panel 100 has a front surface 100A and a rear surface 100B opposite to the front surface 100A, the core plate 200 has a front surface 200A and a rear surface 200B opposite to the front surface 200A, and the rear cover 300 has a front surface 300A and a rear surface 300B opposite to the front surface 300A. The front surface 200A of the core plate 200 is disposed on, and covers, the rear surface 100B of the display panel 100. The front surface 300A of the rear cover 300 is disposed on, and covers at least an upper portion of the rear surface 200B of the core plate 200. Resin 400 (which may also be referred to herein as a resin strip 400 or a resin layer 400) is applied between the display panel 100 and the core plate 200 so that the display panel 100 is attached to a top surface 200C of the core plate 200 via the resin 400.

Figure 5:
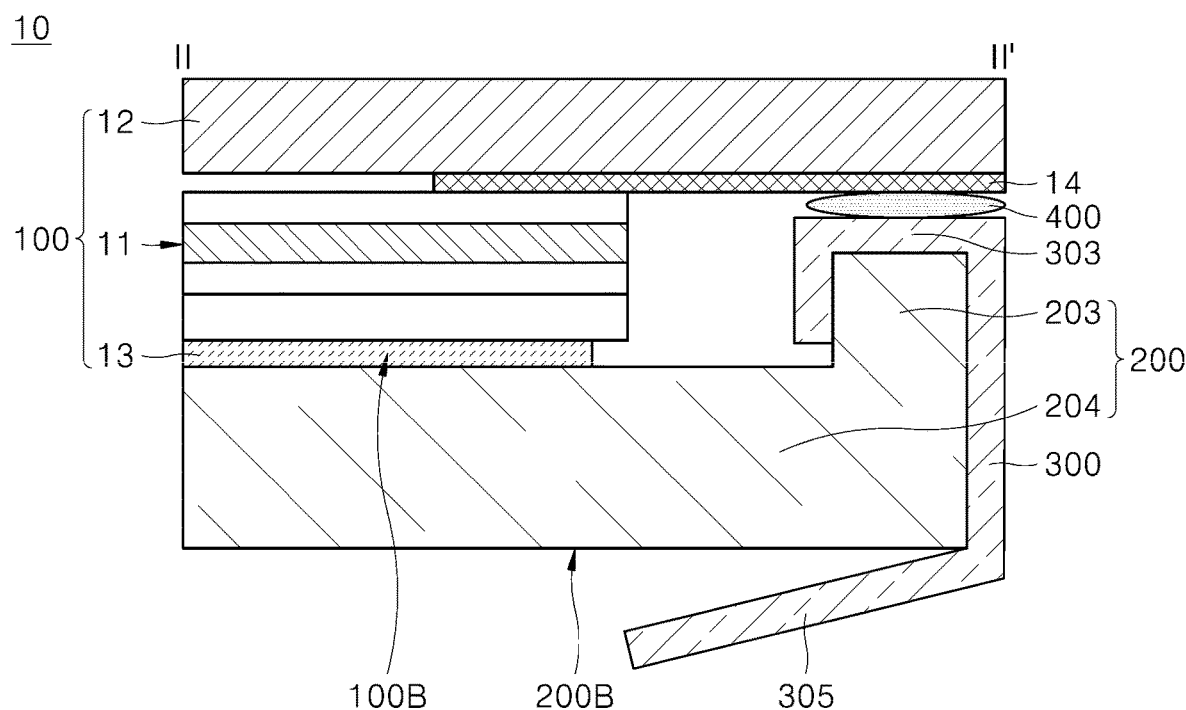
FIG. 5 is a cross-sectional view of the display apparatus of FIG. 1A cut along II-II' of FIG. 1A.

FIG. 5 is a cross-sectional view of the display apparatus 10 along line II-II' of FIG. 1A. Referring to FIG. 5, the display panel 100 may include a substrate 11 on which a light-emitting element is disposed, as described above with reference to FIG. 2, a cover glass 12, a decoration film 14, and an adhesive layer 13. In some embodiments, the decoration film 14 may be attached in a form of a film or may be printed in a form of ink. The display panel 100 may be attached to an inner flat portion 204 of the core plate 200 via the adhesive layer 13 disposed on the back surface 100B of the display panel 100. The core plate 200 includes a protruding portion 203 protruding toward the cover glass 12. The protruding portion 203 is a projection or ridge extending away from the inner flat portion 204 of the core plate 200 toward the cover glass 12 that may be positioned at an outer peripheral edge of the core plate 200. The protruding portion 203 of the core plate 200 enables a connection between the core plate 200, the rear cover 300, and the cover glass 12 of the display panel 100. In particular, the cover glass 12 may be spaced from the inner flat portion 204 of the core plate 200 by an amount corresponding to a thickness of the display panel 100. The protruding portion 203 occupies this space to enable a reliable and strong connection between the core plate 200 and the cover glass 12, while also accommodating a connection with the rear cover 300, as described further below.

The rear cover 300 may have a coupling portion 303 coupled to the protruding portion 203 so as to cover the protruding portion 203. In particular, as shown in FIG. 5, the coupling portion 303 may have an inverted U-shape that interfaces with, and substantially surrounds the protruding portion 203 of the core plate 200. Thus, the coupling portion 303 defines a channel that receives the protruding portion 203 of the core plate 200. The resin 400 may be applied to one surface, such as an outer surface, of the coupling portion 303 of the rear cover 300 coupled to the protruding portion 203 of the core plate 200 such that the rear cover 300 may be adhered to the cover glass 12 to which the decoration film 14 has been attached via the resin 400. As a result, the display panel 100 is coupled to the inner flat portion 204 by the adhesive 13, and the cover glass 12 is coupled to the protruding portion 203 and the rear cover 300 by the resin 400 at a location that is spaced from the interface between the display panel 100 and the adhesive 13. Due to this structure, a separate fixing screw or tape may be omitted in coupling the display panel 100, the core plate 200, and the rear cover 300 together, and thus, an edge area may be minimized. Minimizing the edge area enables a design that may minimize the bezel area of the display apparatus 10. When this embodiment is applied, the bezel area may be reduced by an amount of about 12 mm, compared to the case where the screws or tapes are applied. Specifically, a space utilized for coupling with a screw may be about 17 mm, while in the structure of this embodiment, a space utilized for coupling may be about 5 mm to 5.5 mm based on omission of the screw. The resin 400 may be applied into the space utilized for the coupling as reduced by applying the present embodiment, such that cover glass 12 may be attached to the rear cover 300. Referring to FIG. 5, the rear cover 300 may be manufactured in a shape such that a bottom portion 305 of the rear cover 300 is spaced from the bottom or rear face 200B of the core plate 200 to enable the core plate 200 to be smoothly fitted into the rear cover 300.

FIG. 6 is a detailed perspective view showing the protruding portion 203 of the core plate 200 and the rear cover 300 coupled to each other via the resin 400, with the resin 400 disposed therebetween. In FIG. 6, the display apparatus 10 is illustrated just before the display panel 100 is attached to the rear cover 300 and the core plate 200 to help understanding of the present disclosure.

Figure 7A:
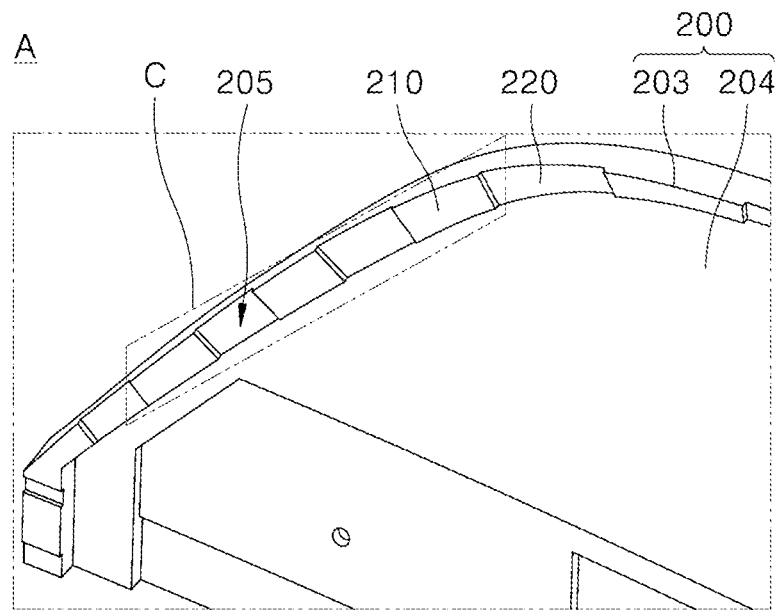
FIG. 7A and FIG. 7B are enlarged views of an area A of the core plate and an area B of the rear cover of FIG. 4, respectively.
Figure 7B:
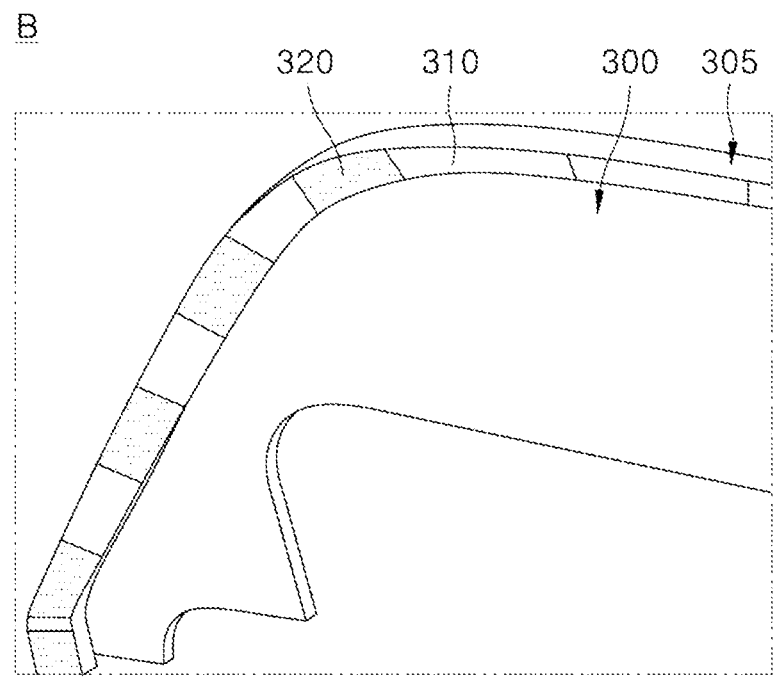

FIG. 7A and FIG. 7B are enlarged views of the area A and the area B of FIG. 4, respectively. FIG. 7A illustrates the protruding portion 203 and the flat portion 204 of the core plate 200 in more detail. In particular, protrusions 210 and grooves 220 may be formed in a top surface 205 of the protruding portion 203 of the core plate 200. The protrusions 210 and the grooves 220 in the top surface 205 of the protruding portion 203 assist with coupling the core plate 200 to the rear cover 300, as described below. The protrusions 210 are arranged to be spaced apart from each other by a certain spacing corresponding to the grooves 220, while the grooves 220 are arranged to be spaced apart from each other by a certain spacing corresponding to the protrusions 210. That is, the protrusions 210 and the grooves 220 are arranged alternately with each other. In an embodiment, the protrusions 210 and grooves 220 are formed across an entirety of the top surface 205, or may be formed on selected portions of the top surface 205. Further, each protrusion 210 and groove 220 may have the same size and shape across the top surface 205, or may have different sizes and shapes.

Referring to FIG. 7B, coupling portions 310 and openings 320 may be formed in an edge area 305 of the rear cover 300 so as to correspond to the grooves 220 and the protrusions 210 of the core plate 200, respectively. For example, each protrusion 210 of the core plate 200 is inserted into each opening 320 of the rear cover 300, while each coupling portion 310 of the rear cover 300 is inserted into each groove 220 of the core plate 200. The coupling portions 310 and the openings 320 are arranged alternately with each other. Thus, the core plate 200 and the rear cover 300 may be coupled to each other without a separate fastener such as a screw or a tape via the protrusions 210 and grooves 220 of the core plate 200 and the corresponding coupling portions 310 and openings 320 in the rear cover 300, such as by a friction fit, a force fit, or with assistance of the resin 400. Coupling robustness and workability may be adjusted based on the density of the protrusions 210 and the grooves 220 of the core plate 200 and the density of the coupling portions 310 and the openings 320 of the rear cover 300. More detailed information thereof will be described later in the description of FIG. 9.

Figure 8:
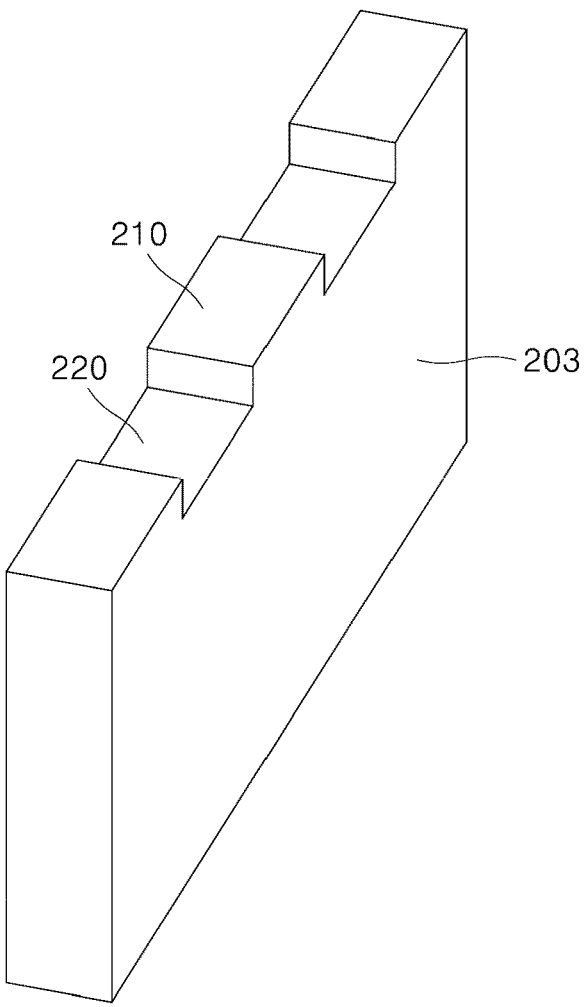
FIG. 8 is an enlarged cross-sectional view of an area C of FIG. 7A showing a protrusion and a groove of the core plate.

FIG. 8 is an enlarged cross-sectional view of a portion C of FIG. 7A and shows a perspective view of the protrusions 210 and the grooves 220 of the protruding portion 203 of the core plate 200. The coupling portion 310 of the rear cover 300 may correspond to the groove 220 of the core plate 200, while the opening 320 of the rear cover 300 may correspond to the protrusion 210 of the core plate 200.

Figure 9:
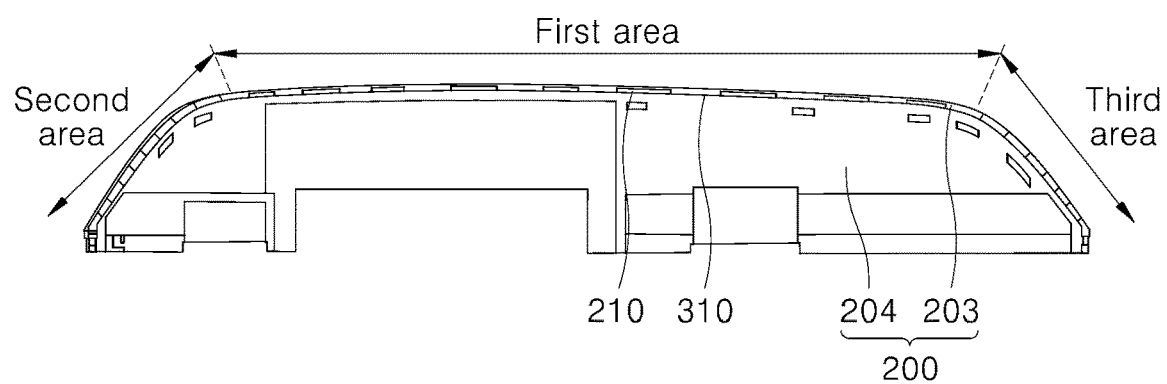
FIG. 9 is a plan view of the display apparatus of FIG. 1 showing a state in which the core plate and the rear cover are coupled to each other.

FIG. 9 is a top plan view of a state in which the core plate 200 and the rear cover 300 are coupled to each other before the display panel 100 is attached thereto.

Referring to FIG. 9, the flat portion 204 may be in direct contact with the display panel 100. The protruding portion 203 may be in contact with the cover glass 12. The protruding portion 203 may be divided into three areas, that is, first to third areas. The protruding portion 203 may disposed only around a top outer peripheral edge of the core plate 200 and not disposed in the inner flat portion 204 of the core plate 200 which receives the display apparatus and couples the display apparatus to the vehicle or the module. The protruding portion 203 may be largely divided into the three areas, based on an inflection point. For example, the protruding portion 203 may be divided into the first area as a top or central area that is generally straight, the second area as a left area, and the third area as a right area in the orientation of FIG. 9. The boundaries of the areas may correspond to inflection points in the curvature of the rounded corners of the outer peripheral edge of the core plate 200. For example, the first area terminates on a right side of the core plate 200 at an inflection point of the curved upper right edge of the core plate 200, and the third area begins at the inflection point and continues to the end of the edge at the bottom of the core plate 200 in the orientation of FIG. 9. The same applies to the interface between the first area and the second area on the left side of the core plate 200. The density of the protrusions 210 and the grooves 220 in the first area may be higher than that of the protrusions 210 and the grooves 220 in each of the second area and the third area. The coupling portion 310 and the opening 320 of the rear cover 300 may be disposed to correspond to the groove 220 and the protrusion 210 of the core plate 200, respectively. When the density of the protrusions 210 and the grooves 220 in the first area is higher than that of the protrusions 210 and the grooves 220 in each of the second area and the third area, the coupling robustness and workability may be improved at the same time. For example, in the first area where the density of the protrusions 210 and the grooves 220 is higher, the core plate 200 and the rear cover 300 come into contact with each other across a larger surface area such that the coupling robustness may be improved and a stronger connection formed in the first area. When the density of the protrusions 210 and the grooves 220 in each of the second area and the third area is lower, the worker may couple the core plate 200 and the rear cover 300 to each other in an easier manner in each of the second area and the third area relative to the first area.

Figure 10A:
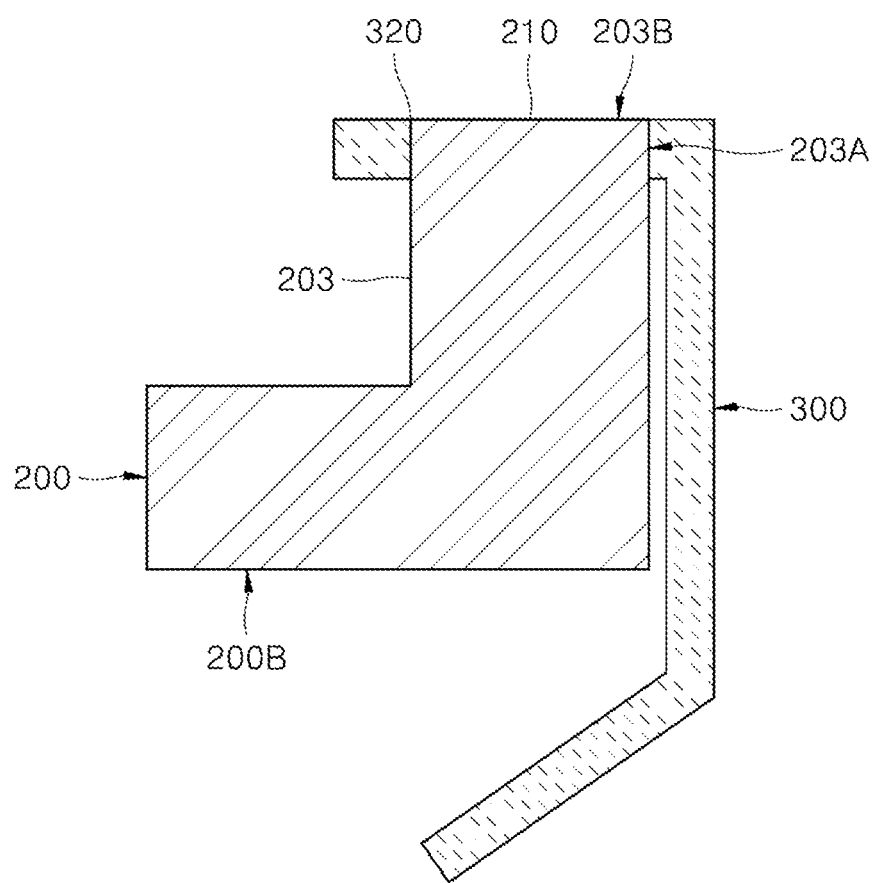
FIG. 10A and FIG. 10B are cross-sectional views of an embodiment in which the core plate and the rear cover are coupled to each other.
Figure 10B:
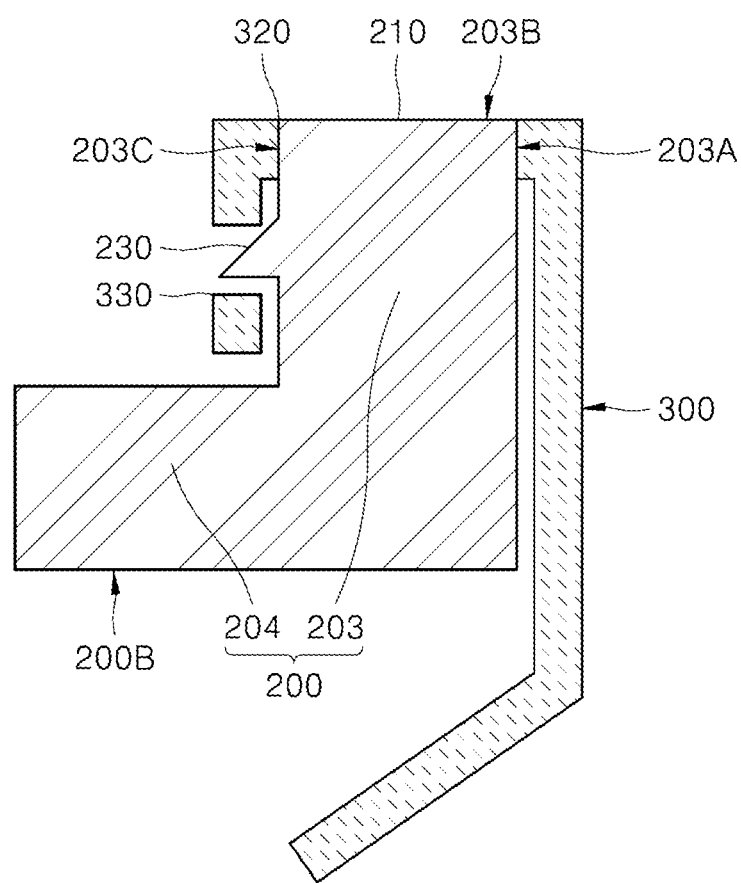

FIG. 10A and FIG. 10B are cross-sectional views of one or more embodiments of the coupling between the protrusions 210 of the core plate 200 and the openings 320 of the rear cover 300 shown in FIG. 9. Referring to FIG. 10A, the rear cover 300 may be disposed to cover a side surface 203A and a top surface 203B of the protruding portion 203 of the core plate 200. The protrusion 210 of the protruding portion 203 and the opening 320 of the rear cover 300 may be directly coupled to each other with the protrusion 210 inserted into the opening 320 so that the core plate 200 and the rear cover 300 may be coupled to each other. Referring to FIG. 10B, the rear cover 300 may be disposed to cover both opposing side surfaces 203A, 203C and the top surface 203B of the protruding portion 203. The first protrusion 210 may be formed on the top surface of the protruding portion 203 and a second protrusion 230 may be formed on an inner side surface of the protruding portion 203. Specifically, in a state where the display panel 100 is coupled to the core plate 200, the second protrusion 230 may face toward the display panel 100. A second opening 330 corresponding to the second protrusion 230 may be defined in an inner vertical portion of the rear cover 300. The first opening 320 may be defined in the top portion of the rear cover 300. Thus, the second protrusion 230 may be inserted into the second opening 330 to provide an additional coupling structure beyond the coupling between the first protrusion 210 and the first opening 320 and further improve the connection between the core plate 200 and the rear cover 300.

In relation to FIG. 9, with continuing reference to FIG. 10A and FIG. 10B, the structure of FIG. 10B may be applied to the first area of FIG. 9 while the structure of FIG. 10A may be applied to each of the second and third areas of FIG. 9. Thus, a relatively strong coupling force may be provided to the larger first area, while a relatively weak coupling force for simplification of the assembly process may be applied to each of the second and third areas where the coupling area is comparatively smaller than the first area. The second protrusion 230 may have a wedge shape, so that the rear cover 300 and the core plate 200 may be completely fixed to each other when the second opening 330 and the second protrusion 230 are coupled to each other.

Referring to FIG. 10A and FIG. 10B, the rear cover 300 may be disposed to be spaced apart from the bottom or rear surface 200B of the core plate 200 by a selected distance. A portion of the rear cover 300 spaced apart from the bottom of the core plate 200 by the selected distance may extend in a selected angle relative to the bottom of the core plate 200. In an embodiment, the selected distance may be less than 1 mm, from 1 to 10 mm, or more than 10 mm including intervening values. The selected angle may be between 0 degrees and 90 degrees, including intervening values. Thus, the core plate 200 and the rear cover 300 may be coupled to each other more smoothly. However, the present disclosure is not limited thereto. The rear cover 300 may be in close contact with the bottom of the core plate 200 in some embodiments.

Figure 11A:
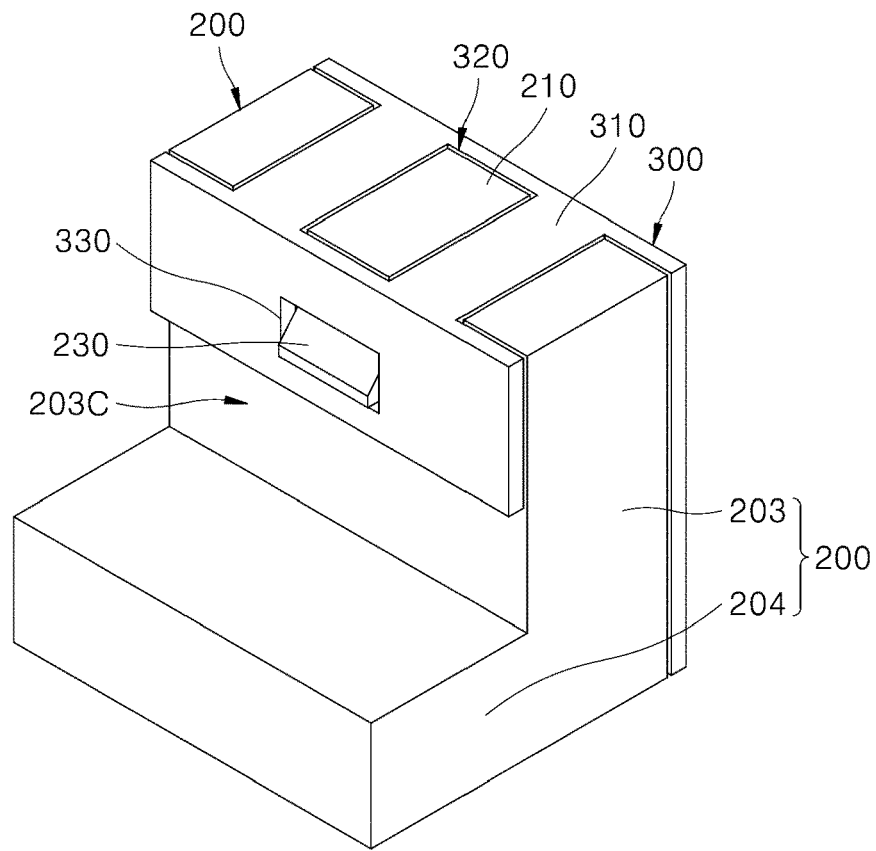
FIG. 11A and FIG. 11B are a perspective view and a plan view, respectively, illustrating the core plate and the rear cover of FIG. 10A and FIG. 10B coupled to each other.
Figure 11B:
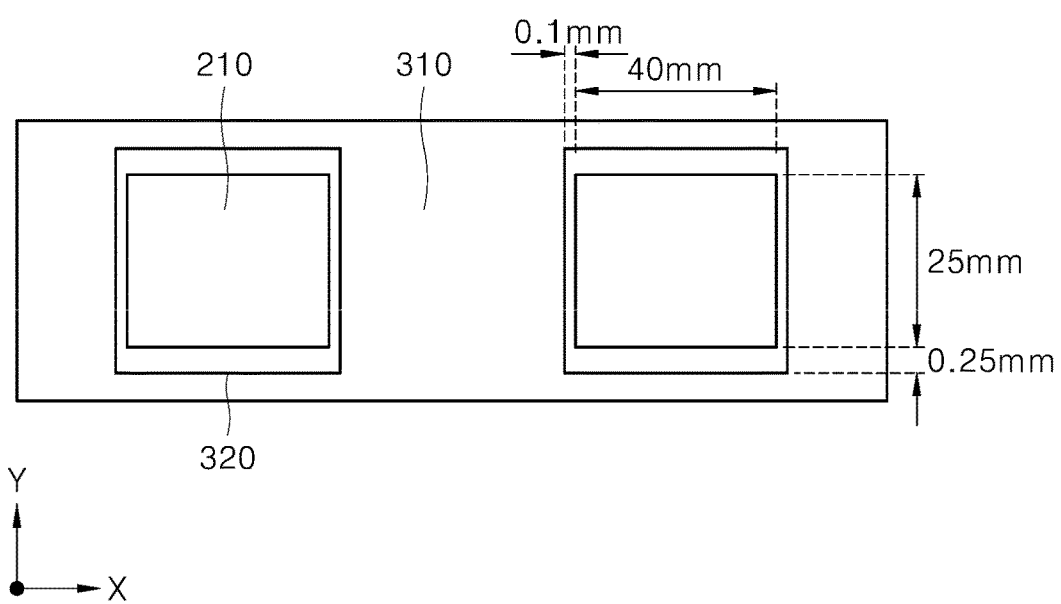

FIG. 11A is a perspective view showing the coupling structure of the core plate 200 and the rear cover 300, based on the embodiment of FIG. 10A and FIG. 10B as described above. FIG. 11B is a top view of a state in which the core plate 200 and the rear cover 300 are coupled to each other. Referring to FIG. 11A, the core plate 200 has the inner flat portion 204 and the protruding portion 203 to be coupled to the rear cover 300. The protrusion 210 and the groove 220 may be formed in the top surface of the protruding portion 203. The coupling portion 310 of the rear cover 300 may correspond to the groove 220, and in FIG. 11A, covers the groove 220. The second protrusion 230 may be formed on the inner side surface 203C of the protruding portion 203 facing the display panel 100. The second opening 330 may be defined in the inner vertical portion of the rear cover 300 so as to correspond to the second protrusion 230. The structure having the second protrusion 230 may refer to FIG. 10B. The structure free of the second protrusion 230 may refer to FIG. 10A.

Referring to FIG. 11B, a size of a planar area of each of the protrusion 210 and the opening 320 may be based on a dimension in a Y direction which is the coupling direction of the core plate 200 and the rear cover 300, and a dimension in a X direction perpendicular to the coupling direction. For example, the protrusion 210 may have a width of about 40 mm in the X-axis direction. The corresponding opening 320 thereto may have a width of about 40.2 mm in the X-axis direction. Although the X direction width of the protrusion 210 and the X direction width of the opening 320 may be substantially the same, a margin gap in the X direction may be formed in the opening 320 for smoother coupling between the core plate 200 and the rear cover 300. A Y-axis direction width of the protrusion 210 may be about 2.5 mm. A width in the Y-axis direction of the opening 320 corresponding thereto may be about 3 mm. Although the Y direction width of the protrusion 210 and the Y direction width of the opening 320 may be substantially the same, a margin gap in the Y direction may be formed in the opening 320 for smoother coupling between the core plate 200 and the rear cover 300.

Figure 12A:
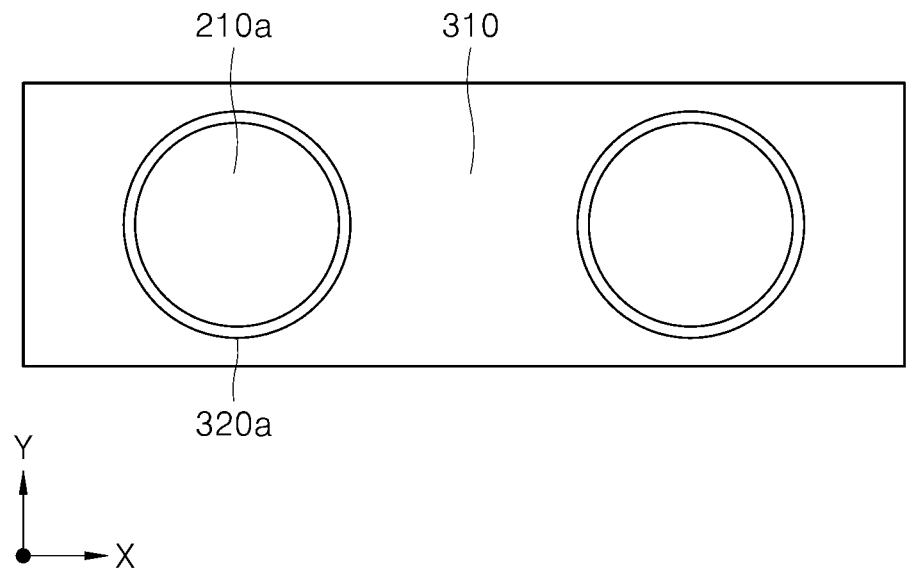
FIG. 12A and FIG. 12B are plan views showing an embodiment of a coupling between the core plate and the rear cover.
Figure 12B:
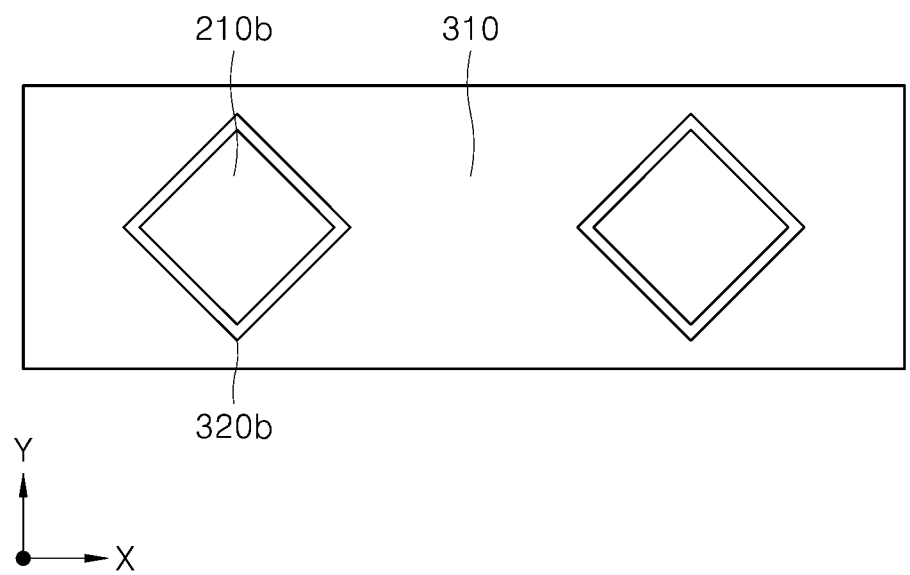

FIG. 12A and FIG. 12B show additional embodiments related to the shape of each of the protrusion 210 of the protruding portion 203 of the core plate 200 and the opening 320 of the coupling portion of the rear cover 300. Referring to FIG. 12A, a plan view in which the core plate 200 and the rear cover 300 are coupled to each other is shown. A circular protrusion 210a and a circular opening 320a are coupled to each other. Each of the circular protrusion 210a and the circular opening 320a has a circular shape compared to the rectangular protrusion 210 shown in FIG. 7A or FIG. 11. Thus, during coupling of the core plate 200 and the rear cover 300 to each other, stress may be evenly distributed around the circular protrusion pattern. In the rectangular protrusion pattern, the stress may be concentrated on a right-angled corner. Thus, the square corners may be damaged due to the stress concentration. On the contrary, in the circular protrusion 201*a* in FIG. 12A, when the Y-axis direction coupling between the core plate 200 and the rear cover 300 is performed, the stress may be evenly distributed around the protrusion without being concentrated locally due to the shape of the circular protrusion 201*a*. The stress may be evenly distributed around the circular opening 320*a* of the core plate 200. Thus, the damage to the protrusion and the opening that may otherwise occur during coupling between the core plate 200 and the rear cover 300 may be minimized.

Referring to FIG. 12B, the coupling plane where the core plate 200 and the rear cover 300 are coupled to each other is shown. In this regard, a rhombus protrusion 210*b* and a rhombus opening 320*b* are coupled to each other. Compared to the rectangular protrusion 210 shown in FIG. 7A or FIG. 11, each of the rhombus protrusion 210*b* and the rhombus opening 320*b* has a smaller planar area perpendicular to the Y-axis direction when the core plate 200 and the rear cover 300 are coupled to each other. A small fastening force to couple the core plate 200 and the rear cover 300 to each other may therefore be utilized. Due to this advantage, the rhombus protrusion 210*b* may be used.

Figure 13A:
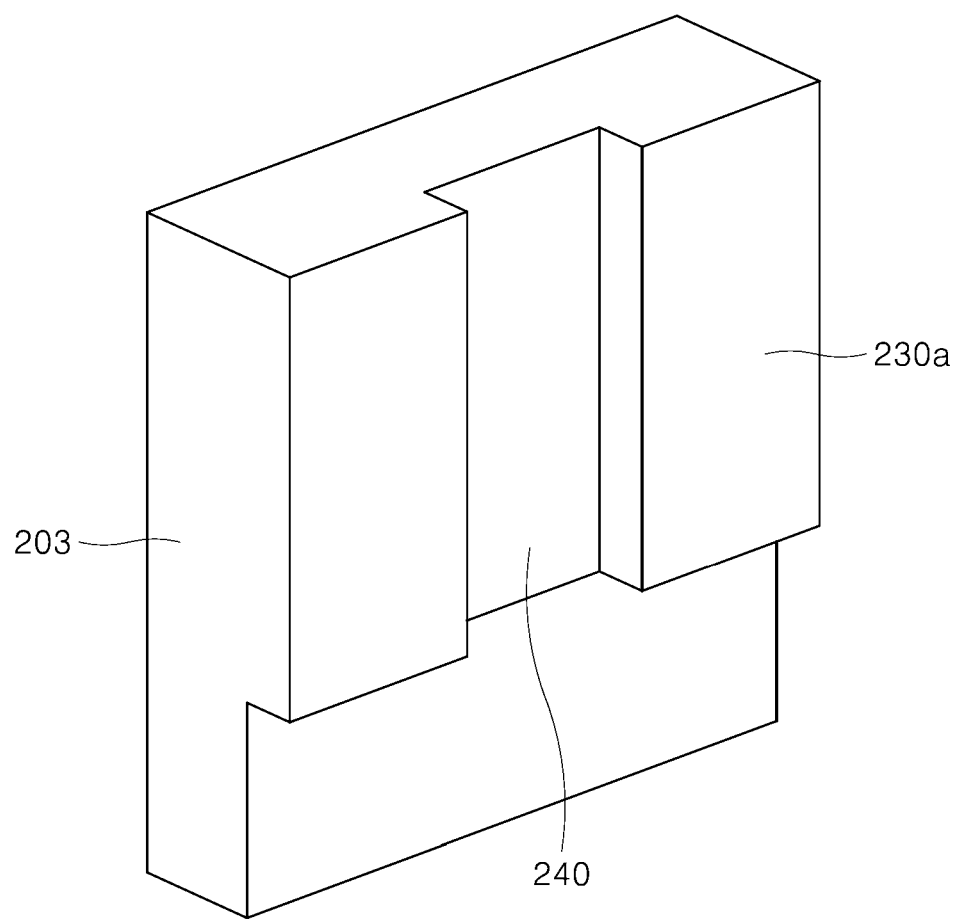
FIG. 13A and FIG. 13B are plan views showing an embodiment of a coupling between the core plate and the rear cover.
Figure 13B:
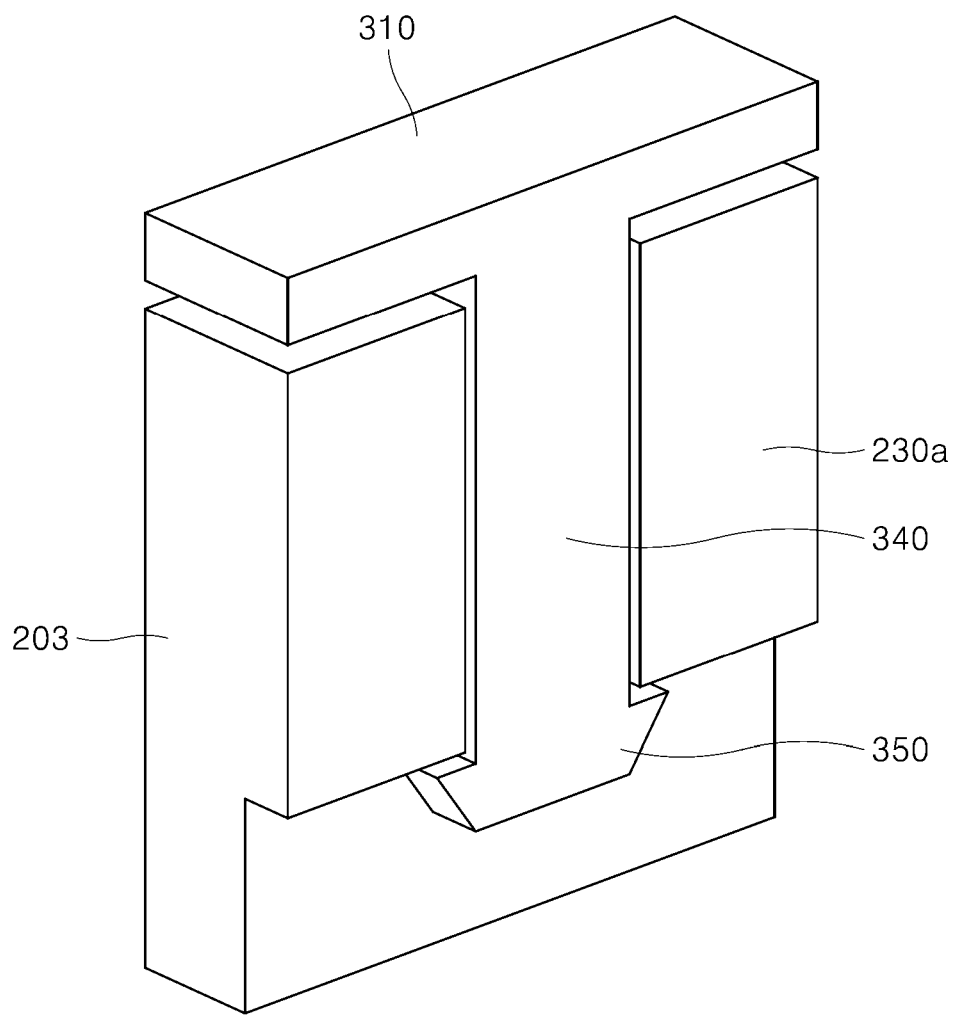

FIG. 13A to FIG. 13B show another example of the coupling structure of the core plate 200 and the rear cover 300. In the structures of FIG. 11A and FIG. 11B and FIG. 12A and FIG. 12B, it may be difficult to detach the core plate 200 and the rear cover 300 from each other. For example, quality problem may occur during the coupling process of the core plate 200 and the rear cover 300 or after the display apparatus is attached to the vehicle or the set. When the quality problem occurs, it may be beneficial to detach the core plate 200 and the rear cover 300 from each other. For this purpose, a design of the core plate 200 and the rear cover 300 may be modified.

Referring to FIG. 13A, two second protrusions 230*a* may be formed on the vertical side surface of the protruding portion 203 of the core plate 200, and extend downwardly and vertically and may be spaced from each other. Thus, a second groove 240 may be defined between the two second protrusion 230*a* and may extend vertically. Referring to FIG. 13B, the rear cover 300 has the coupling portion 310 and a vertical extension 340 with a coupling head 350 formed at a lower end of the vertical extension 340. Referring to FIG. 11A, the second protrusion 230 of the core plate 200 has a wedge shape and is coupled to the second opening 330 of the rear cover 300, whereas in this embodiment, the second groove 240 is provided on the protruding portion 203, the vertical extension 340 may be inserted into the second groove 240, and the wedge-shaped coupling head 350 may engage with lower ends of the second protrusions 230*a*. Thus, the core plate 200 and the rear cover 300 may be detached from each other by lifting up the extension 340 and the coupling head 350 connected thereto so as to be removed from the second groove 240. In an embodiment, the extension 340 and the coupling head 350 of the rear cover 300 as well as the rear cover 300 generally may be made of a material with higher elasticity and may be manufactured using a double injection scheme in order to provide the extension 340 and the coupling head 350 with elasticity for the above removable coupling functionality.

Figure 14A:
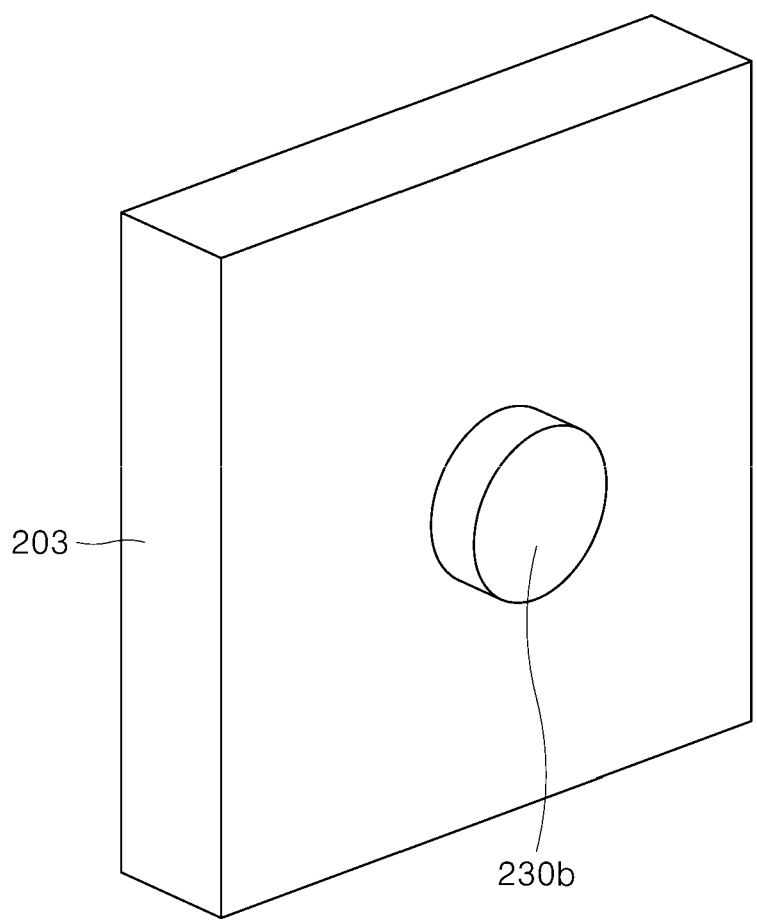
FIG. 14A and FIG. 14B are plan views showing an embodiment of the coupling between the core plate and the rear cover.
Figure 14B:
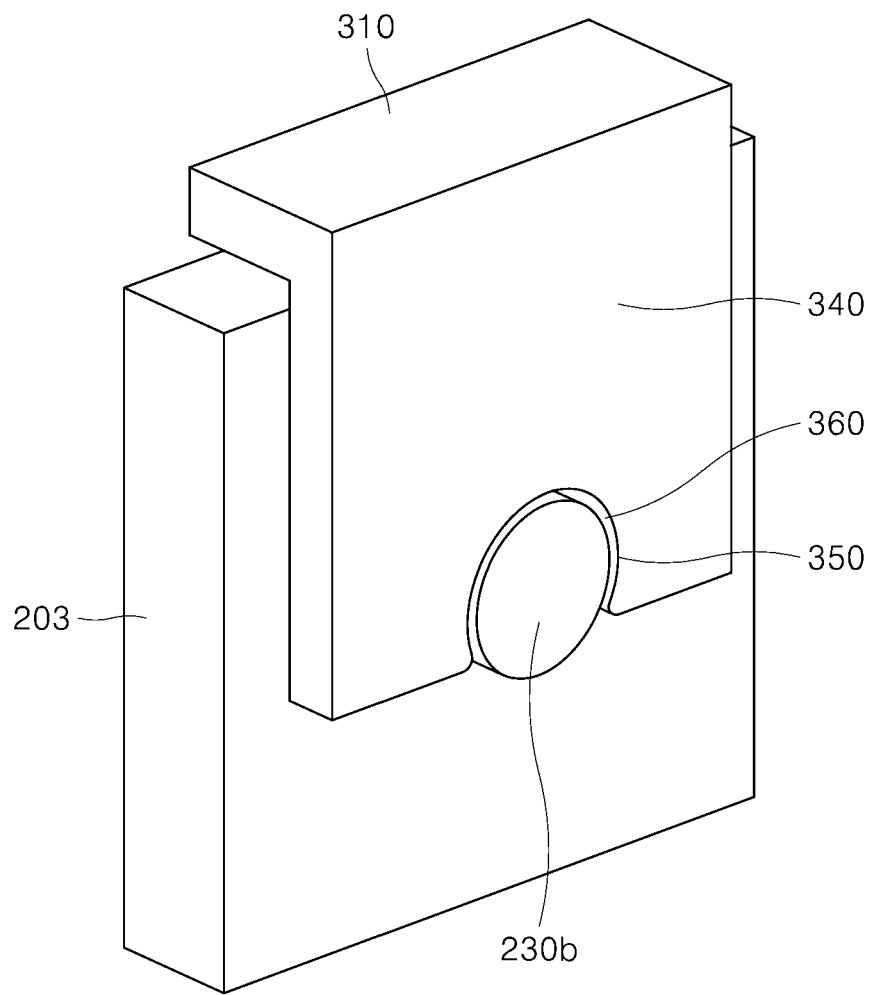

FIG. 14A and FIG. 14B show another example of the coupling structure between the core plate 200 and the rear cover 300. The core plate 200 and the rear cover 300 may be removably coupled to each other. Referring to FIG. 14A, at least one second protrusion 230*b* is formed on a vertical side surface of the protruding portion 203 facing the display panel 100. The second protrusion 230*b* may have a circular shape. Referring to FIG. 14B, in order to correspond to the second protrusion 230*b* provided in FIG. 14A, the rear cover 300 has a vertical extension 340 extending downwardly from the coupling portion 310 of the rear cover 300. A second opening 360 may be defined in a lower end of the vertical extension 340. The vertical extension 340 may be made of a material with elasticity and the second opening 360 has a circular shape. The second opening 360 extends to a point between about ½ and about ¾ of a diameter of the second protrusion 230*b* such that a bottom tip of the second protrusion 230*b* may protrude downwardly out of the opening 360. Since the extension 340 in which the opening 360 is defined is made of a material with elastic ability, the opening 360 may be deformed when the second protrusion 230*b* is fitted into the opening 360 in a force fit, snap fit, or a friction fit. Thus, the core plate 200 and the rear cover 300 are coupled to each other or removed from each other when the protrusion 230*b* is inserted into or removed from the opening 360.

Figure 15:
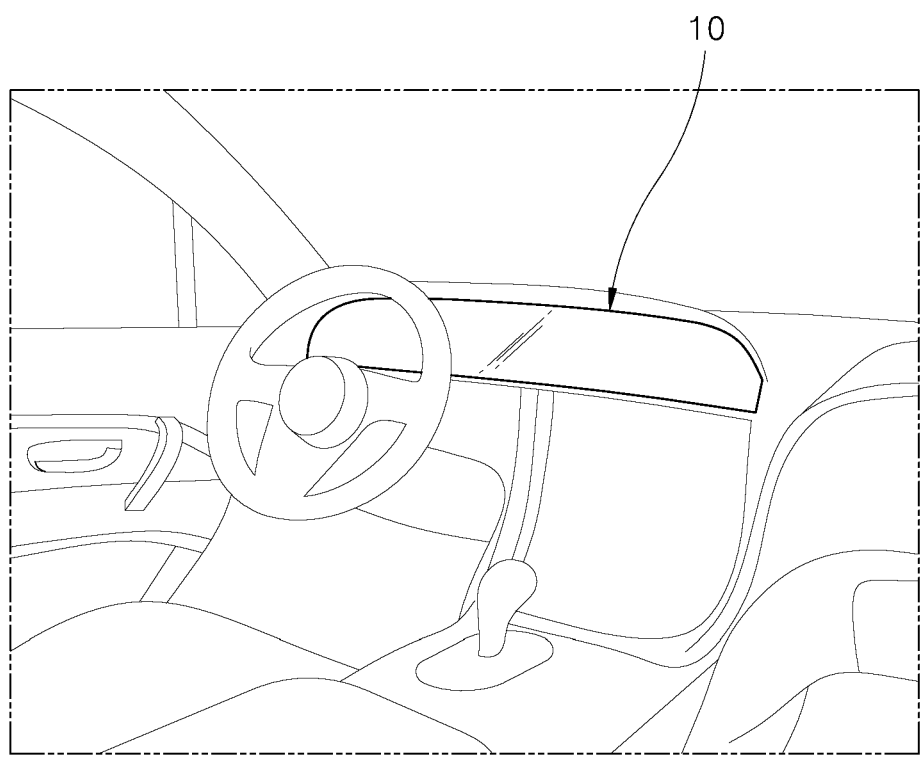
FIG. 15 is a diagram showing an interior of a vehicle to which the display apparatus of an embodiment of the present disclosure is applied.

FIG. 15 is a diagram showing a state in which the display apparatus 10 is disposed on a vehicle.

With reference to FIG. 15 and FIG. 1B, the first connector 201 and the second connector 202 of the core plate 200 may be fixed to the dashboard or the center fascia of the vehicle. Thus, the display apparatus 10 may be mounted on the vehicle. Thus, a driver or a passenger may utilize an infotainment system provided from the display apparatus.

A display apparatus according to an embodiment of the present disclosure may be described as follows.

According to an embodiment of the present disclosure, a display apparatus comprises a display panel; a decoration film and a cover glass disposed on a front surface of the display panel; a core plate supporting a rear surface of the display panel and attached to the rear surface thereof; and a rear cover coupled to a rear surface of the core plate; wherein the core plate has a protruding portion protruding toward the cover glass, wherein the rear cover has a coupling portion coupled to the protruding portion so as to covers at least a portion of the protruding portion, wherein resin is applied to at least a portion of the coupling portion and the rear cover is adhered to the decoration film or the cover glass via the resin.

In some embodiments of the present disclosure, the protruding portion has: a first protrusion extending from a top surface of the protruding portion in a first direction toward the cover glass; and a groove defined in the top surface of the protruding portion.

In some embodiments of the present disclosure, the rear cover has an opening defined therein, wherein the first protrusion and the opening are coupled to each other.

In some embodiments of the present disclosure, the coupling portion and the groove of the protruding portion are coupled to each other.

In some embodiments of the present disclosure, the protruding portion of the core plate has a second protrusion protruding from a vertical surface of the protruding portion in a second direction perpendicular to the first direction.

In some embodiments of the present disclosure, the second protrusion faces toward the display panel coupled to the core plate.

In some embodiments of the present disclosure, the first protrusion has a rectangular planar shape.

In some embodiments of the present disclosure, the protruding portion of the core plate has one or more second protrusions protruding from a vertical inner side surface of the protruding portion in a second direction toward the display panel, wherein a vertically extending groove is defined between the second protrusions, wherein the rear cover has a vertical extension extending downwardly from the coupling portion, and a coupling head formed at a lower end of the vertical extension, wherein the vertical extension is inserted into the groove, and the coupling head is caught with a lower end of the second protrusions.

In some embodiments of the present disclosure, the protruding portion of the core plate has one or more second protrusions formed on a vertical inner side surface of the protruding portion in a second direction toward the display panel, wherein the rear cover has a vertical extension extending downwardly from the coupling portion, and one or more second grooves defined in the vertical extension, wherein the second protrusion is inserted into the second groove.

According to an embodiment of the present disclosure, a display apparatus comprises a display panel including a flexible substrate; a decoration film and a cover glass disposed on a front surface of the display panel; a core plate supporting a rear surface of the display panel and attached to the rear surface thereof; and a rear cover coupled to a rear surface of the core plate; wherein the core plate has an edge area divided into a first area, a second area and a third area, wherein the core plate has a protruding portion protruding toward the cover glass, wherein the protruding portion is disposed in the edge area, wherein resin is applied to at least a portion of the protruding portion and the rear cover is adhered to the decoration film or the cover glass via the resin.

In some embodiments of the present disclosure, the protruding portion has a first protrusion extending from the top surface of the protruding portion in a first direction toward the cover glass; and a groove defined in the top surface of the protruding portion, wherein the rear plate has a coupling portion coupled to the groove.

In some embodiments of the present disclosure, the protruding portion has a plurality of first protrusions extending from the top surface of the protruding portion in a first direction toward the cover glass, wherein the plurality of first protrusions are arranged in the edge area, wherein an arrangement density of the plurality of first protrusions in the first area is different from an arrangement density of the plurality of first protrusions in each of the second and third areas.

In some embodiments of the present disclosure, the arrangement density of the plurality of first protrusions in the first area is higher than the arrangement density of the plurality of first protrusions in each of the second and third areas.

In some embodiments of the present disclosure, the protruding portion of the core plate has at least one second protrusion protruding from a vertical inner side surface of the protruding portion in a second direction perpendicular to the first direction, wherein the at least one second protrusion is positioned in the first area.

In some embodiments of the present disclosure, each of the first protrusions has a planar shape of a rectangle, a circle, or a rhombus.

In some embodiments of the present disclosure, the protruding portion of the core plate has one or more second protrusions protruding from a vertical inner side surface of the protruding portion in a second direction perpendicular to the first direction, wherein a vertically extending groove is defined between the second protrusions, wherein the rear cover has a vertical extension extending downwardly from the coupling portion, and a coupling head formed at a lower end of the vertical extension, wherein the vertical extension is inserted into the groove, and the coupling head is caught with a lower end of the second protrusions.

In some embodiments of the present disclosure, the protruding portion of the core plate has one or more second protrusions formed on a vertical inner side surface of the protruding portion in a second direction perpendicular to the first direction, wherein the rear cover has a vertical extension extending downwardly from the coupling portion, and one or more second grooves defined in the vertical extension, wherein the second protrusion is inserted into the second groove.

A scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A display apparatus comprising:
a display panel;
a cover glass disposed on a front surface of the display panel;
a core plate coupled to a rear surface of the display panel, the core plate including a protruding portion extending toward the cover glass;
a rear cover coupled to a rear surface of the core plate, the rear cover including a coupling portion coupled to the protruding portion of the core plate and disposed to cover at least a portion of the protruding portion of the core plate; and
a resin layer between at least a portion of the coupling portion of the rear cover and the cover glass, wherein the protruding portion of the core plate further includes:
    a first protrusion extending from a top surface of the protruding portion in a first direction toward the cover glass; and
    a groove in the top surface of the protruding portion.

2. The display apparatus of claim 1, wherein the rear cover has an opening, the first protrusion received in the opening.

3. The display apparatus of claim 1, wherein the coupling portion of the rear cover is received in the groove of the protruding portion of the core plate.

4. The display apparatus of claim 1, wherein the protruding portion of the core plate has a second protrusion extending from a vertical surface of the protruding portion in a second direction perpendicular to the first direction.

5. The display apparatus of claim 4, wherein the first protrusion of the protruding portion of the core plate extends toward the cover glass and the second protrusion faces toward the display panel.

6. The display apparatus of claim 1, wherein the first protrusion has a rectangular planar shape.

7. The display apparatus of claim 1, wherein the protruding portion of the core plate has one or more second protrusions extending from a vertical inner side surface of the protruding portion in a second direction toward the display panel, and wherein the protruding portion of the core plate has a vertically extending second groove adjacent the one or more second protrusions, and
    wherein the rear cover has a vertical extension extending from the coupling portion, and a coupling head at a lower end of the vertical extension, and
    wherein the vertical extension of the rear cover is removably inserted into the vertically extending second groove, and the coupling head removably engages a lower end of the one or more second protrusions.

8. The display apparatus of claim 1, wherein the protruding portion of the core plate has one or more second protrusions on a vertical inner side surface of the protruding portion and extending in a second direction toward the display panel, and
    wherein the rear cover has a vertical extension extending from the coupling portion, and one or more second grooves in the vertical extension, and
    wherein the one or more second protrusions are inserted into the one or more second grooves.

9. The display apparatus of claim 1, further comprising:
a decoration film disposed on the cover glass, the resin layer between at least the portion of the coupling portion of the rear cover and the decoration film.

10. A display apparatus comprising:
a display panel including a flexible substrate;
a cover glass disposed on the display panel;
a core plate coupled to the display panel, the core plate having an edge area and a protruding portion in the edge area extending toward the cover glass;
a rear cover coupled to the core plate; and
a resin between at least a portion of the protruding portion of the rear cover and the cover glass,
wherein the protruding portion of the core plate further includes:
    a first protrusion extending from the protruding portion in a first direction toward the cover glass; and
    a groove in the protruding portion, and
wherein the rear cover has a coupling portion received in the groove of the protruding portion of the core plate.

11. The display apparatus of claim 10, wherein the edge area of the core plate includes a first area, a second area, and a third area, and
    wherein the protruding portion of the core plate has a plurality of first protrusions extending from the protruding portion in a first direction toward the cover glass in the edge area, and
    wherein a density of the plurality of first protrusions in the first area is different from a density of the plurality of first protrusions in each of the second and third areas of the edge area.

12. The display apparatus of claim 11, wherein the density of the plurality of first protrusions in the first area is greater than the density of the plurality of first protrusions in each of the second and third areas.

13. The display apparatus of claim 11, wherein the protruding portion of the core plate has at least one second protrusion extending from an inner side surface of the protruding portion in a second direction perpendicular to the first direction, and
    wherein the at least one second protrusion is positioned in the first area of the edge area.

14. The display apparatus of claim 11, wherein each of the plurality of first protrusions has a planar shape of a rectangle, a circle, or a rhombus.

15. The display apparatus of claim 10, wherein the protruding portion of the core plate has one or more second protrusions extending from an inner side surface of the protruding portion in a second direction perpendicular to the first direction with a vertically extending second groove adjacent the one or more second protrusions,
    wherein the rear cover has a vertical extension extending downwardly from the coupling portion, and a coupling head at a lower end of the vertical extension, and
    wherein the vertical extension is removably inserted into the vertically extending second groove, and the coupling head is removably engaged with a lower end of the one or more second protrusions.

16. The display apparatus of claim 10, wherein the protruding portion of the core plate has one or more second protrusions extending from an inner side surface of the protruding portion in a second direction perpendicular to the first direction, and
    wherein the rear cover has a vertical extension extending downwardly from the coupling portion, and one or more second grooves defined in the vertical extension, and
    wherein the one more second protrusions are inserted into the one or more second grooves.

17. The display apparatus of claim 10, further comprising:
a decoration film disposed on the cover glass, the resin layer between at least the portion of the protruding portion of the core plate and the decoration film.

\* \* \* \* \*